US007830070B2

(12) United States Patent
Babaev

(10) Patent No.: US 7,830,070 B2
(45) Date of Patent: Nov. 9, 2010

(54) ULTRASOUND ATOMIZATION SYSTEM

(75) Inventor: Eilaz Babaev, Minnetonka, MN (US)

(73) Assignee: Bacoustics, LLC, Minnetonka, MN (US)

( * ) Notice: Subject to any disclaimer, the term of this patent is extended or adjusted under 35 U.S.C. 154(b) by 530 days.

(21) Appl. No.: 12/029,507

(22) Filed: Feb. 12, 2008

(65) Prior Publication Data

US 2009/0200390 A1 Aug. 13, 2009

(51) Int. Cl.
*H01L 41/08* (2006.01)

(52) U.S. Cl. .................................... 310/335; 239/102.1

(58) Field of Classification Search ................. 310/334, 310/335; 239/102.1, 102
See application file for complete search history.

(56) References Cited

U.S. PATENT DOCUMENTS

| | | | | |
|---|---|---|---|---|
| 3,970,250 | A | | 7/1976 | Drews |
| 4,153,201 | A | | 5/1979 | Berger et al. |
| 4,402,458 | A | | 9/1983 | Lierke et al. |
| 4,655,393 | A | | 4/1987 | Berger |
| 4,684,328 | A | | 8/1987 | Murphy |
| 4,715,353 | A | | 12/1987 | Koike et al. |
| 4,739,762 | A | | 4/1988 | Palmaz |
| 4,850,534 | A | | 7/1989 | Takahashi et al. |
| 5,076,266 | A | | 12/1991 | Babaev |
| 5,119,775 | A | | 6/1992 | Kokubo et al. |
| 5,133,732 | A | | 7/1992 | Wiktor |
| 5,179,923 | A | | 1/1993 | Tsurutani et al. |
| 5,292,331 | A | | 3/1994 | Boneau |
| 5,336,534 | A | | 8/1994 | Nakajima et al. |
| 5,409,163 | A | | 4/1995 | Erickson et al. |
| 5,516,043 | A | | 5/1996 | Manna |
| 5,540,384 | A | | 7/1996 | Erickson et al. |
| 5,582,348 | A | | 12/1996 | Erickson et al. |
| 5,597,292 | A | | 1/1997 | Rhee et al. |
| 5,611,993 | A | * | 3/1997 | Babaev ........................ 422/20 |
| 5,803,106 | A | | 9/1998 | Cohen et al. |
| 5,868,153 | A | | 2/1999 | Cohen et al. |
| 5,891,507 | A | | 4/1999 | Jayaraman |
| 5,922,247 | A | | 7/1999 | Shoham et al. |
| 5,970,974 | A | | 10/1999 | Van Der Linden et al. |
| 5,996,903 | A | | 12/1999 | Asai et al. |
| 6,053,424 | A | | 4/2000 | Gipson et al. |
| 6,102,298 | A | | 8/2000 | Bush |
| 6,234,765 | B1 | | 5/2001 | Deak |
| 6,237,525 | B1 | | 5/2001 | Kinnunen |

(Continued)

FOREIGN PATENT DOCUMENTS

| | | | |
|---|---|---|---|
| EP | 424532 | A4 | 12/1991 |

(Continued)

*Primary Examiner*—Mark Budd

(57) ABSTRACT

An ultrasound atomization apparatus including an ultrasound transducer, a horn attached to the distal end of the transducer, a chamber within the horn that receives a fluid to be atomized, a radiation surface, and a channel leading from the chamber to the radiation surface. Vibrations produced by the transducer travel down the horn to the radiation surface. The vibrations induce the release of energy into the fluid to be atomized as it travels through the horn's internal chamber and exits the horn at the radiation surface. Controllably increasing the kinetic energy of the fluid, energy emitted into the fluid assists and/or drives fluid atomization. Assisting and/or driving fluid atomization by utilizing vibrations to increase the kinetic energy of the fluid, the ultrasound atomization apparatus can preserve a desired spray pattern when changing environmental conditions would otherwise destroy the spray pattern and/or reduce atomization.

21 Claims, 2 Drawing Sheets

U.S. PATENT DOCUMENTS

| | | | |
|---|---|---|---|
| 6,247,525 | B1 | 6/2001 | Smith et al. |
| 6,402,046 | B1 | 6/2002 | Loser |
| 6,478,754 | B1 | 11/2002 | Babaev |
| 6,530,370 | B1 | 3/2003 | Heinonen |
| 6,533,803 | B2 | 3/2003 | Babaev |
| 6,543,700 | B2 | 4/2003 | Jameson et al. |
| 6,569,099 | B1 | 5/2003 | Babaev |
| 6,601,581 | B1 | 8/2003 | Babaev |
| 6,623,444 | B2 | 9/2003 | Babaev |
| 6,656,506 | B1 | 12/2003 | Wu et al. |
| 6,663,554 | B2 | 12/2003 | Babaev |
| 6,706,337 | B2 | 3/2004 | Hebert |
| 6,720,710 | B1 | 4/2004 | Wenzel et al. |
| 6,723,064 | B2 | 4/2004 | Babaev |
| 6,730,349 | B2 | 5/2004 | Schwartz |
| 6,739,520 | B2 | 5/2004 | Ohnishi et al. |
| 6,761,729 | B2 | 7/2004 | Babaev |
| 6,767,637 | B2 | 7/2004 | Park et al. |
| 6,811,805 | B2 | 11/2004 | Gilliard et al. |
| 6,837,445 | B1 | 1/2005 | Tsai |
| 6,845,759 | B2 | 1/2005 | Ohnishi et al. |
| 6,883,729 | B2 | 4/2005 | Putvinski et al. |
| 6,908,622 | B2 | 6/2005 | Barry et al. |
| 6,908,624 | B2 | 6/2005 | Hossayniy et al. |
| 6,913,617 | B1 | 7/2005 | Riess |
| 6,960,173 | B2 | 11/2005 | Babaev |
| 6,964,647 | B1 | 11/2005 | Babaev |
| 7,017,282 | B2 | 3/2006 | Pyo et al. |
| 7,086,617 | B2 | 8/2006 | Fukumoto et al. |
| 7,780,095 | B2 * | 8/2010 | Babaev .................... 239/102.2 |
| 2002/0044171 | A1 * | 4/2002 | Hirahara et al. ............... 347/46 |
| 2002/0082666 | A1 | 6/2002 | Babaev |
| 2002/0103448 | A1 | 8/2002 | Babaev |
| 2002/0127346 | A1 | 9/2002 | Heber |
| 2002/0138036 | A1 | 9/2002 | Babaev |
| 2002/0156400 | A1 | 10/2002 | Babaev |
| 2002/0190136 | A1 | 12/2002 | Babaev |
| 2003/0098364 | A1 | 5/2003 | Jameson |
| 2003/0153961 | A1 | 8/2003 | Babaev |
| 2003/0171701 | A1 | 9/2003 | Babaev |
| 2003/0223886 | A1 | 12/2003 | Keilman |
| 2003/0225451 | A1 | 12/2003 | Sundar |
| 2003/0229304 | A1 | 12/2003 | Babaev |
| 2003/0236560 | A1 | 12/2003 | Babaev |
| 2004/0030254 | A1 | 2/2004 | Babaev |
| 2004/0039375 | A1 | 2/2004 | Miyazawa |
| 2004/0045547 | A1 | 3/2004 | Yamamoto et al. |
| 2004/0186384 | A1 | 9/2004 | Babaev |
| 2004/0204680 | A1 | 10/2004 | Lal et al. |
| 2004/0224001 | A1 | 11/2004 | Pacetti et al. |
| 2004/0234748 | A1 | 11/2004 | Stenzel |
| 2004/0236399 | A1 | 11/2004 | Sundar |
| 2004/0254638 | A1 | 12/2004 | Byun |
| 2005/0015024 | A1 | 1/2005 | Babaev |
| 2005/0064088 | A1 | 3/2005 | Fredrickson |
| 2006/0025716 | A1 | 2/2006 | Babaev |
| 2006/0058710 | A1 | 3/2006 | Babaev |
| 2007/0016110 | A1 | 1/2007 | Babaev |
| 2007/0031611 | A1 | 2/2007 | Babaev |
| 2007/0051307 | A1 | 3/2007 | Babaev |
| 2007/0088217 | A1 | 4/2007 | Babaev |
| 2007/0088245 | A1 | 4/2007 | Babaev |
| 2007/0088386 | A1 | 4/2007 | Babaev |
| 2007/0185527 | A1 | 8/2007 | Babaev |
| 2007/0231346 | A1 | 10/2007 | Babaev |
| 2007/0233054 | A1 | 10/2007 | Babaev |
| 2007/0239250 | A1 | 10/2007 | Babaev |
| 2007/0244528 | A1 | 10/2007 | Babaev |
| 2007/0295832 | A1 | 12/2007 | Gibson et al. |
| 2008/0006714 | A1 | 1/2008 | McNichols et al. |
| 2008/0033349 | A1 * | 2/2008 | Suzuki ........................ 604/35 |
| 2008/0058844 | A1 * | 3/2008 | Morawski et al. ........... 606/167 |
| 2008/0188792 | A1 * | 8/2008 | Barrett ........................ 604/22 |
| 2008/0194967 | A1 * | 8/2008 | Sliwa et al. ................. 600/472 |
| 2009/0200396 | A1 * | 8/2009 | Babaev .................... 239/102.2 |
| 2010/0185150 | A1 * | 7/2010 | Zacharias ................... 604/119 |

FOREIGN PATENT DOCUMENTS

| | | | |
|---|---|---|---|
| EP | 416106 | A4 | 3/1992 |
| EP | 1370321 | A1 | 12/2003 |
| EP | 1322275 | A4 | 10/2004 |
| EP | 1526825 | A1 | 5/2005 |
| EP | 1596940 | A1 | 11/2005 |
| EP | 1617910 | A1 | 1/2006 |
| EP | 1355696 | A4 | 5/2006 |
| SU | 1237261 | | 6/1986 |
| WO | 9011135 | A1 | 10/1990 |
| WO | 9012655 | A1 | 11/1990 |
| WO | 9707830 | A1 | 3/1997 |
| WO | 9717933 | A1 | 5/1997 |
| WO | 0224150 | A3 | 3/2002 |
| WO | 02055131 | A3 | 7/2002 |
| WO | 02055150 | A3 | 7/2002 |
| WO | 02060525 | A3 | 8/2002 |
| WO | 0228350 | C1 | 10/2002 |
| WO | 02065456 | A1 | 10/2002 |
| WO | 02076547 | A1 | 10/2002 |
| WO | 2004069469 | A1 | 2/2003 |
| WO | 2004014284 | B1 | 7/2004 |
| WO | 2004091722 | C1 | 5/2006 |
| WO | 2007002598 | A3 | 1/2007 |
| WO | 2007018980 | A3 | 2/2007 |
| WO | 2007021427 | A3 | 2/2007 |
| WO | 2007046989 | A3 | 4/2007 |
| WO | 2007046990 | A2 | 4/2007 |
| WO | 2007117800 | A2 | 10/2007 |
| WO | 2007117964 | A2 | 10/2007 |
| WO | 2007121123 | A2 | 10/2007 |

* cited by examiner

ULTRASOUND ATOMIZATION SYSTEM

BACKGROUND OF THE INVENTION

The present invention relates to an apparatus utilizing ultrasonic waves traveling through a horn and/or resonant structure to atomize and/or assist in the atomization of fluids passing through the horn and/or resonant structure.

Liquid atomization is a process by which a liquid is separated into small droplets by some force acting on the liquid, such as ultrasound. Ultrasonic atomization systems are employed in situations where creating sprays of a highly atomized liquid is desirable. For example, ultrasonic atomizers are often utilized to apply coatings to various devices and products. Exposing a liquid to ultrasound creates vibrations and/or cavitations within the liquid that break it apart into small droplets. U.S. Pat. No. 4,153,201 to Berger et al., U.S. Pat. No. 4,655,393 to Berger, and U.S. Pat. No. 5,516,043 to Manna et al. describe examples of atomization systems utilizing ultrasound to atomize a liquid. These devices possess a tip vibrated by ultrasonic waves passing through the tip. Within the tips are central passages that carry the liquid to be atomized. The liquid within the central passage is driven towards the end of the tip by some force acting upon the liquid. Upon reaching the end of the tip, the liquid to be atomized is expelled from the tip. Ultrasonic waves emanating from the front of the tip then collide with the liquid, thereby breaking the liquid apart into small droplets.

SUMMARY OF THE INVENTION

An ultrasound atomization apparatus capable of producing an atomized spray of fluid is disclosed. The apparatus comprises a horn having an internal chamber including a back wall, a front wall, and at least one side wall, a radiation surface at the horn's distal end, at least one channel opening into the chamber, and a channel originating in the front wall of the internal chamber and terminating in the radiation surface. Connected to the horn's proximal end, a transducer powered by a generator induces ultrasonic vibrations within the horn. Traveling down the horn from the transducer to the horn's radiation surface, the ultrasonic vibrations induce the release of ultrasonic energy into the fluid to be atomized as it travels through the horn's internal chamber and exits the horn at the radiation surface. Controllably increasing the kinetic energy of the fluid, ultrasonic energy emitted into the fluid assists and/or drives fluid atomization. Assisting and/or driving fluid atomization by utilizing ultrasonic energy to increase the kinetic energy of the fluid, the ultrasound atomization apparatus can preserve a desired spray pattern when changing environmental conditions would otherwise destroy the spray pattern and/or reduce atomization.

As with typical pressure driven fluid atomizers, the ultrasound atomization apparatus utilizes pressure changes within the fluid to create the kinetic energy that drives atomization. The fluid to be atomized enters the apparatus through a channel opening into the internal chamber. The fluid then flows through the chamber and into a channel extending from the chamber's front wall to the radiation surface. If the channel originating in the front wall of the internal chamber is narrower than the chamber, the pressure of the fluid flowing through the channel decreases as the fluid's velocity increases. Because the fluid's kinetic energy is proportional to its velocity squared, the kinetic energy of the fluid increases as it flows through the channel. Breaking the attractive forces between the molecules of the fluid, the increased kinetic energy of the fluid causes the fluid to atomize as it exits the horn at the radiation surface.

Unfortunately, pressure driven fluid atomization can be adversely impacted by changes in environmental conditions. Most notably, a change in the pressure of the environment into which the atomized fluid is to be sprayed may decrease the level of atomization and/or distort the spray pattern. As a fluid passes through a pressure driven fluid atomizer, it is pushed backwards by the pressure of the environment. Thus, the net pressure acting on the fluid is the difference of the pressure pushing the fluid through the atomizer and the pressure of the environment. It is the net pressure of the fluid that is converted to kinetic energy. Thus, as the environmental pressure increases, the net pressure decreases, causing a reduction in the kinetic energy of the fluid exiting the horn. An increase in environmental pressure, therefore, reduces the level of fluid atomization.

The pressure of the environment into which the fluid is sprayed may increase for several reasons. For instance, natural weather patterns may result in an increase in environmental pressure. A chemical reaction in which the atomized fluid is a substrate may also cause an increase in environmental pressure. For example, a chemical reaction in which the molecules of the atomized fluid are separated and/or otherwise broken apart into smaller molecules may lead to an increase in environmental pressure. Likewise, the addition of reagents to the environment outside the horn, as to increase the yield of the chemical reaction, may also increase the environmental pressure.

By increasing the kinetic energy of the fluid, ultrasonic energy emanating from various points of the horn may assist the atomization of the fluid as to counteract an increase in environmental pressure. When the proximal end of the horn is secured to an ultrasound transducer, activation of the transducer induces ultrasonic vibrations within the horn. The vibrations can be conceptualized as ultrasonic waves traveling from the proximal end to the distal end of the horn. As the ultrasonic vibrations travel down the length of the horn, the horn contracts and expands. However, the entire length of the horn is not expanding and contracting. Instead, the segments of the horn between the nodes of the ultrasonic vibrations (points of minimum deflection or amplitude) are expanding and contracting. The portions of the horn lying exactly on the nodes of the ultrasonic vibrations are not expanding and contracting. Therefore, only the segments of the horn between the nodes are expanding and contracting, while the portions of the horn lying exactly on nodes are not moving. It is as if the ultrasound horn has been physically cut into separate pieces. The pieces of the horn corresponding to nodes of the ultrasonic vibrations are held stationary, while the pieces of the horn corresponding to the regions between nodes are expanding and contracting. If the pieces of the horn corresponding to the regions between nodes were cut up into even smaller pieces, the pieces expanding and contracting the most would be the pieces corresponding to the antinodes of ultrasonic vibrations (points of maximum deflection or amplitude).

The expansion and contraction of the horn causes the back wall of the internal chamber to move forwards and backwards. Moving forwards and backwards, the back wall emits ultrasonic energy into the fluid within the chamber. As the back wall moves forward it hits the fluid within the chamber. Striking the fluid within the chamber, like a mallet hitting a gong, the back wall of the chamber emits, or induces, vibrations within the fluid. The vibrations traveling through the fluid possess the same frequency as the ultrasonic vibrations traveling through the horn. The farther forwards and backwards the back wall of the chamber moves, the more forcefully the back wall strikes the fluid within the chamber and the higher the amplitude of the ultrasonic vibrations emitted into the fluid. Inducing vibrations within the fluid, the movement of the chamber's back wall increases the kinetic energy of the fluid traveling through the chamber. The increased kinetic energy of the fluid improves the atomization of the fluid as it exits at the radiation surface, thereby counteracting a decrease in atomization caused by changing environmental conditions.

A counteracting increase in the kinetic energy of the fluid may also be induced from the ultrasonic vibrations emanating from the radiation surface. Like the back wall of the internal chamber, the radiation surface is also moving forwards and backwards when ultrasonic vibrations travel down the length of the horn. Consequently, as the radiation surface moves forward it strikes the fluid exiting the horn and the surrounding air. Striking the exiting fluid and surrounding air, the radiation surface emits, or induces, vibrations within the exiting fluid. As such, the kinetic energy of the exiting fluid increases. The increased kinetic energy further atomizes the fluid exiting at the radiation surface, thereby counteracting a decrease in atomization caused by changing environmental conditions.

The increased kinetic energy imparted on the fluid by the movement of the chamber's back wall and/or the radiation surface can be controlled by adjusting the amplitude of the ultrasonic vibrations traveling down the length of the horn. Increasing the amplitude of the ultrasonic vibrations increases the amount of kinetic energy imparted on the fluid as it travels through the chamber and/or exits at the radiation surface. If the horn is ultrasonically vibrated in resonance by a piezoelectric transducer driven by an electrical signal supplied by a generator, then increasing the voltage of the electrical signal will increase the amplitude of the ultrasonic vibrations traveling down the horn.

As with increases in environmental pressure, decreases in environmental pressure may adversely impact the atomized spray. Because the net pressure acting on the fluid is converted to kinetic energy and the net pressure acting on the fluid is the difference between the pressure pushing the fluid through the atomizer and the pressure of the environment, decreasing the environmental pressure increases the kinetic energy of the fluid exiting a pressure driven atomizer. Thus, as the environmental pressure decreases, the exiting velocity of the fluid increases. Exiting the atomizer at a higher velocity, the atomized fluid droplets move farther away from the atomizer, thereby widening the spray pattern. Changing the spray pattern may lead to undesirable consequences. For instance, widening the spray pattern may direct the atomized fluid away from its intended target and/or towards unintended targets. Thus, a decrease in environmental pressure may result in a detrimental un-focusing of the atomized spray.

Adjusting the amplitude of the ultrasonic waves traveling down the length of the horn may be useful in focusing the atomized spray produced at the radiation surface. Creating a focused spray may be accomplished by utilizing the ultrasonic vibrations emanating from the radiation surface to confine and direct the spray pattern. Ultrasonic vibrations emanating from the radiation surface may direct and confine the vast majority of the atomized spray produced within the outer boundaries of the radiation surface. The level of confinement obtained by the ultrasonic vibrations emanating from the radiation surface depends upon the amplitude of the ultrasonic vibrations traveling down the horn. As such, increasing the amplitude of the ultrasonic vibrations passing through the horn may narrow the width of the spray pattern produced; thereby focusing the spray. For instance, if the spray is fanning too wide, increasing the amplitude of the ultrasonic vibrations may narrow the spray pattern. Conversely, if the spray is too narrow, then decreasing the amplitude of the ultrasonic vibrations may widen the spray pattern.

Changing the geometric conformation of the radiation surface may also alter the shape of the spray pattern. Producing a roughly column-like spray pattern may be accomplished by utilizing a radiation surface with a planar face. Generating a spray pattern with a width smaller than the width of the horn may be accomplished by utilizing a tapered radiation surface. Further focusing of the spray may be accomplished by utilizing a concave radiation surface. In such a configuration, ultrasonic waves emanating from the concave radiation surface may focus the spray through the focus of the radiation surface. If it is desirable to focus, or concentrate, the spray produced towards the inner boundaries of the radiation surface, but not towards a specific point, then utilizing a radiation surface with slanted portions facing the central axis of the horn may be desirable. Ultrasonic waves emanating from the slanted portions of the radiation surface may direct the atomized spray inwards, towards the central axis. There may, of course, be instances where a focused spray is not desirable. For instance, it may be desirable to quickly apply an atomized liquid to a large surface area. In such instances, utilizing a convex radiation surface may produce a spray pattern with a width wider than that of the horn. The radiation surface utilized may possess any combination of the above mentioned configurations such as, but not limited to, an outer concave portion encircling an inner convex portion and/or an outer planar portion encompassing an inner conical portion. Inducing resonating vibrations within the horn facilitates the production of the spray patterns described above, but may not be necessary.

It should be noted and appreciated that other benefits and/or mechanisms of operation, in addition to those listed above and/or below, may be elicited by devices in accordance with the present invention. The mechanisms of operation presented herein are strictly theoretical and are not meant in any way to limit the scope this disclosure and/or the accompanying claims.

DETAILED DESCRIPTION OF THE INVENTION

Preferred embodiments of the ultrasound atomization apparatus are illustrated throughout the figures and described in detail below. Those skilled in the art will understand the advantages provided by the atomization apparatus upon review.

Figure 1A:
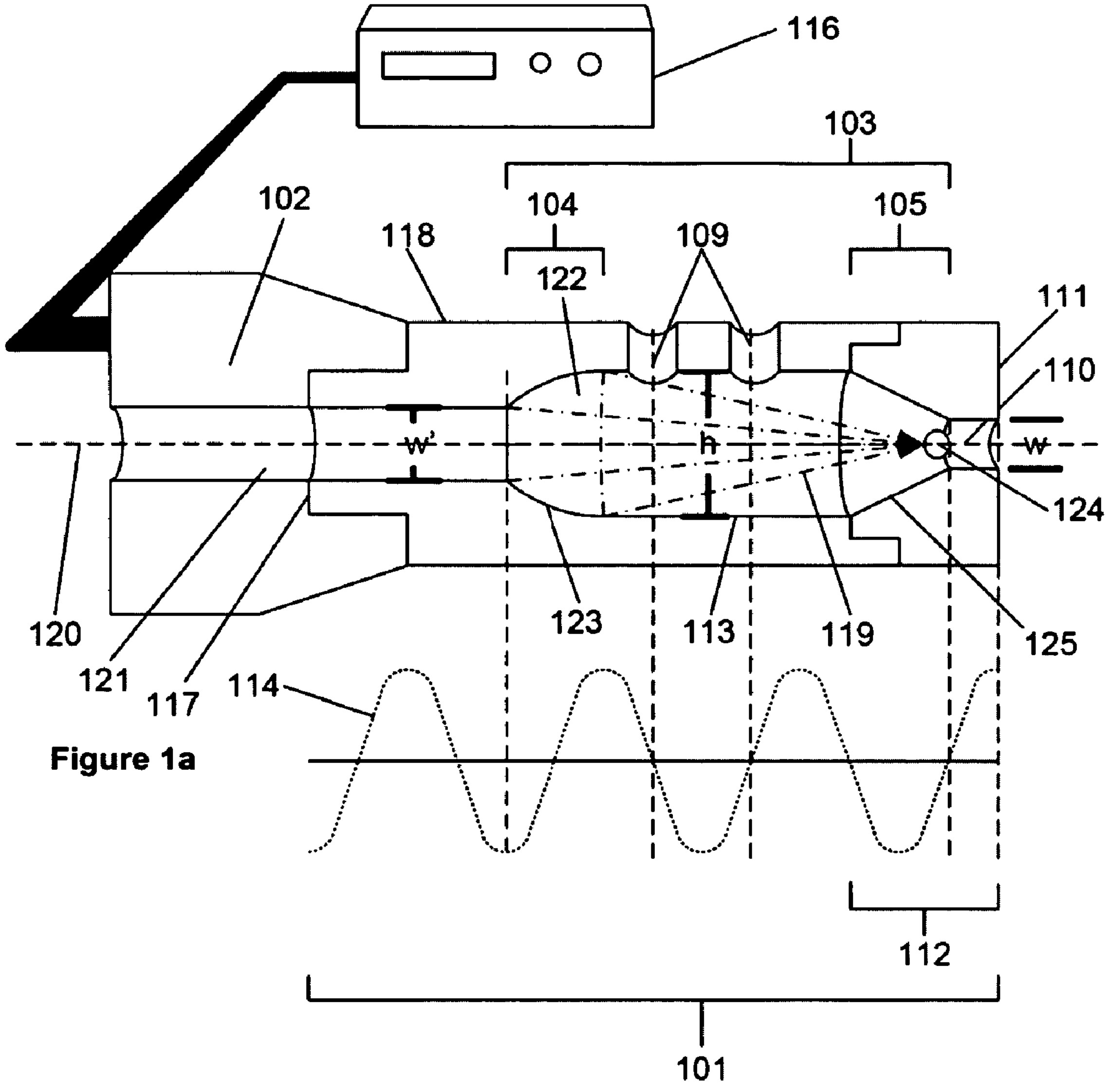
FIGS. 1*a* and 1*b* illustrate cross-sectional views of an embodiment of the ultrasound atomization apparatus.
Figure 1B:
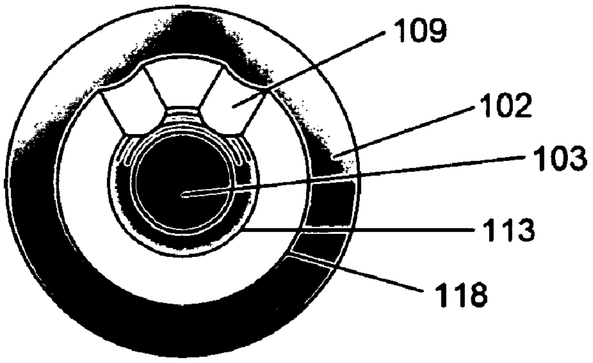

FIGS. 1*a* and 1*b* illustrate an embodiment of the ultrasound atomization apparatus comprising a horn 101 and an ultrasound transducer 102 attached to the proximal surface 117 of horn 101 powered by generator 116. As ultrasound transducers and generators are well known in the art they need not be described in detail herein. Ultrasound horn 101 comprises a proximal surface 117, a radiation surface 111 opposite proximal end 117, and at least one radial surface 118 extending between proximal surface 117 and radiation surface 111. Within horn 101 is an internal chamber 103 containing a back wall 104, a front wall 105, at least one side wall 113 extending between back wall 104 and front wall 105, and an ultrasonic lens 122 within back wall 104. As to induce vibrations within horn 101, ultrasound transducer 102 may be mechanically coupled to proximal surface 117. Mechanically coupling horn 101 to transducer 102 may be achieved by mechanically attaching (for example, securing with a threaded connection), adhesively attaching, and/or welding horn 101 to transducer 102. Other means of mechanically coupling horn 101 and transducer 102, readily recognizable to persons of ordinary skill in the art, may be used in combination with or in the alternative to the previously enumerated means. Alternatively, horn 101 and transducer 102 may be a single piece. When transducer 102 is mechanically coupled to horn 101, driving transducer 102 with an electrical signal supplied from generator 116 induces ultrasonic vibrations 114 within horn 101. If transducer 102 is a piezoelectric transducer, then the amplitude of the ultrasonic vibrations 114 traveling down the length of horn 101 may be increased by increasing the voltage of the electrical signal driving transducer 102.

As the ultrasonic vibrations 114 travel down the length of horn 101, back wall 104 oscillates back-and-forth. The back-and-forth movement of back wall 104 induces the release ultrasonic vibrations from lens 122 into the fluid inside chamber 103. Positioning back wall 104 such that at least one point on lens 122 lies approximately on an antinode of the ultrasonic vibrations 114 passing through horn 101 may maximize the amount and/or amplitude of the ultrasonic vibrations emitted into the fluid in chamber 103. Preferably, the center of lens 122 lies approximately on an antinode of the ultrasonic vibrations 114. The ultrasonic vibrations emanating from lens 122, represented by arrows 119, travel towards the front of chamber 103. As to minimize the oscillations and/or vibrations of front wall 105, it may be desirable to position front wall 105 such that at least one point on front wall 105 lies on a node of the ultrasonic vibrations 114. Preferably, the center of front wall 105 lies approximately on a node of the ultrasonic vibrations 114.

The specific lens illustrated in FIG. 1*a* contains a concave portion 123. If the concave portion 123 forms an overall parabolic configuration in at least two dimensions, then the ultrasonic vibrations depicted by arrows 119 emanating from concave portion 123 of lens 122 travel in an undisturbed pattern of convergence towards the parabola's focus 124. As the ultrasonic vibrations 119 converge at focus 124, the ultrasonic energy carried by vibrations 119 may become focused at focus 124. The fluid passing through chamber 103 is therefore exposed to the greatest concentration of ultrasonic energy at focus 124. Consequently, the ultrasonically induced increase in the kinetic energy of the fluid is greatest at focus 124. Positioning focus 124 at or near the opening of channel 110, as to be in close proximity to the opening of channel 110 in front wall 105, therefore, yields the maximum increase in kinetic energy as the fluid enters channel 110.

In the alternative or in combination the ultrasonic lens within the back wall of the chamber may also contain convex portions. For instance, the ultrasonic lens within the back wall of the chamber may contain an outer concave portion encircling an inner convex portion.

Front wall 105 of chamber 103 may contain slanted portion 125, as depicted in FIG. 1*a*. Slanted portion 125 of front wall 105 may funnel the fluid flowing through chamber 103 into channel 110. If the ultrasonic vibrations emanating from lens 122 are directed towards a point in close proximity to the opening of channel 110, it may be desirable for slanted portion 125 of front wall 105 to form an angle equal to or greater than the angle of convergence of the ultrasonic vibrations emitted from the peripheral boundaries of ultrasonic lens 122.

The fluid and/or fluids to be atomized enter chamber 103 of the embodiments depicted in FIGS. 1*a* and 1*b* through at least one channel 109 originating in radial surface 118 and opening into chamber 103. Preferably, channel 109 encompasses a node of the ultrasonic vibrations 114 traveling down the length of the horn 101 and/or emanating from lens 122. In the alternative or in combination, channel 109 may originate in radial surface 118 and open at back wall 104 into chamber 103. Upon exiting channel 109, the fluid flows through chamber 103. The fluid then exits chamber 103 through channel 110, originating within front wall 105 and terminating within radiation surface 111. As the fluid to be atomized passes through channel 110, the pressure of the fluid decreases while its velocity increases. Thus, as the fluid flows through channel 110, the pressure acting on the fluid is converted to kinetic energy. If the fluid gains sufficient kinetic energy as it passes through channel 110, then the attractive forces between the molecules of the fluid may be broken, causing the fluid to atomize as it exits channel 110 at radiation surface 111. If the fluid passing through horn 101 is to be atomized by the kinetic energy gained from its passage through channel 110, then the maximum height (h) of chamber 103 should be larger than maximum width (w) of channel 110. Preferably, the maximum height of chamber 103 should be approximately 200 times larger than the maximum width of channel 110 or greater.

It is preferable if at least one point on radiation surface 111 lies approximately on an antinode of the ultrasonic vibrations 114 passing through horn 101.

As to simplify manufacturing, ultrasound horn 101 may further comprise cap 112 attached to its distal end. Cap 112 may be mechanically attached (for example, secured with a threaded connector), adhesively attached, and/or welded to the distal end of horn 101. Other means of attaching cap 112 to horn 101, readily recognizable to persons of ordinary skill in the art, may be used in combination with or in the alternative to the previously enumerated means. Comprising front wall 105, channel 110, and radiation surface 111, a removable cap 112 permits the level of fluid atomization and/or the spray pattern produced to be adjusted depending on need and/or circumstances. For instance, the width of channel 110 may need to be adjusted to produce the desired level of atomization with different fluids. The geometrical configuration of the radiation surface may also need to be changed as to create the appropriate spray pattern for different applications. Attaching cap 112 to the present invention at approximately a nodal point of the ultrasonic vibrations 114 passing through horn 101 may help prevent the separation of cap 112 from horn 101 during operation.

It is important to note that fluids of different temperatures may be delivered into chamber 103 as to improve the atomization of the fluid exiting channel 110. This may also change the spray volume, the quality of the spray, and/or expedite the drying process of the fluid sprayed.

Alternative embodiments of an ultrasound horn 101 in accordance with the present invention may possess a single channel 109 opening within side wall 113 of chamber 103. If multiple channels 109 are utilized, they may be aligned along the central axis 120 of horn 101, as depicted in FIG. 1*a*. Alternatively or in combination, channels 109 may be located on different platans, as depicted in FIG. 1*a*, and/or the same platan, as depicted in FIG. 1*b*.

Alternatively or in combination, the fluid to be atomized may enter chamber 103 through a channel 121 originating in proximal surface 117 and opening within back wall 104. If fluids are be atomized by their passage through horn 101, then the maximum width (w') of channel 121 should be smaller than the maximum height of chamber 103. Preferably, the maximum height of chamber 103 should be approximately twenty times larger than the maximum width of channel 121.

A single channel may be used to deliver the fluids to be atomized into chamber 103. When horn 101 includes multiple channels opening into chamber 103, atomization of the fluids may be improved by delivering a gas into chamber 103 through at least one of the channels.

Horn 101 and chamber 103 may be cylindrical, as depicted in FIG. 1. Horn 101 and chamber 103 may also be constructed in other shapes and the shape of chamber 103 need not correspond to the shape of horn 101.

The increase in the kinetic energy of the fluid caused by the exposure to ultrasonic vibrations 119 in chamber 103 and/or the fluid's passage through channel 110 may atomize the fluid exiting from horn 101 at radiation surface 111. The energy carried by the ultrasonic vibrations emanating from radiation surface 111 may also atomize the exiting fluid. In addition or in the alternative to increasing the atomization of the fluid, the ultrasonic vibrations emanating from radiation surface 111 may direct the atomized fluid spray.

Figure 2A:
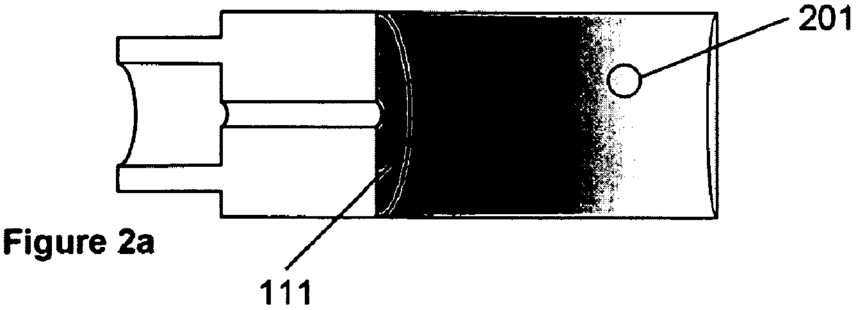
FIGS. 2*a* through 2*e* illustrate alternative embodiments of the radiation surface.
Figure 2B:
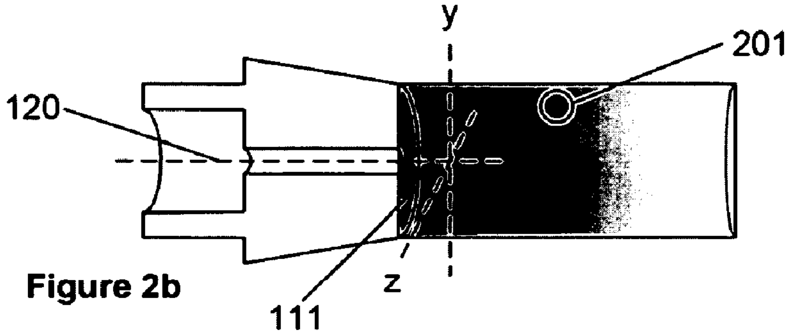

The manner in which ultrasonic vibrations emanating from the radiation surface direct the spray of fluid ejected from channel 110 depends largely upon the conformation of radiation surface 111. FIGS. 2*a*-2*e* illustrate alternative embodiments of the radiation surface. FIGS. 2*a* and 2*b* depict radiation surfaces 111 comprising a planar face producing a roughly column-like spray pattern. Radiation surface 111 may be tapered such that it is narrower than the width of the horn in at least one dimension oriented orthogonal to the central axis 120 of the horn, as depicted FIG. 2*b*. Ultrasonic vibrations emanating from the radiation surfaces 111 depicted in FIGS. 2*a* and 2*b* may direct and confine the vast majority of spray 201 ejected from channel 110 to the outer boundaries of the radiation surfaces 111. Consequently, the majority of spray 201 emitted from channel 110 in FIGS. 4*a* and 4*b* is initially confined to the geometric boundaries of the respective radiation surfaces.

Figure 2C:
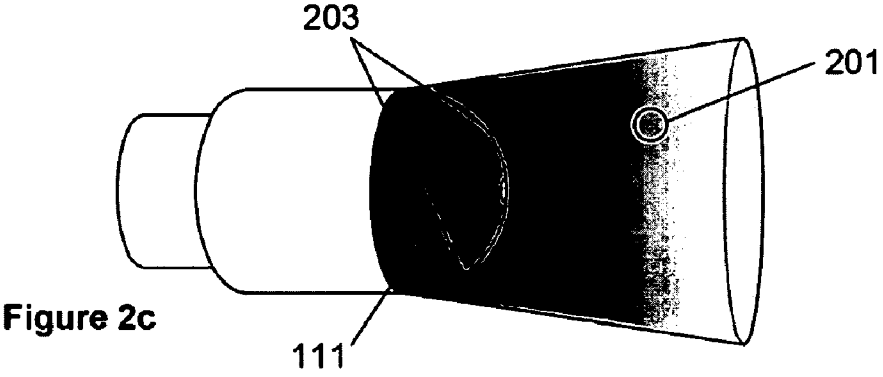
Figure 2D:
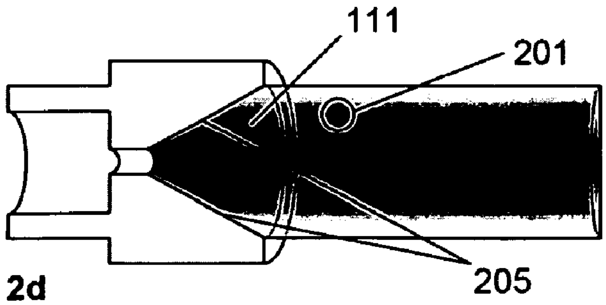
Figure 2E:
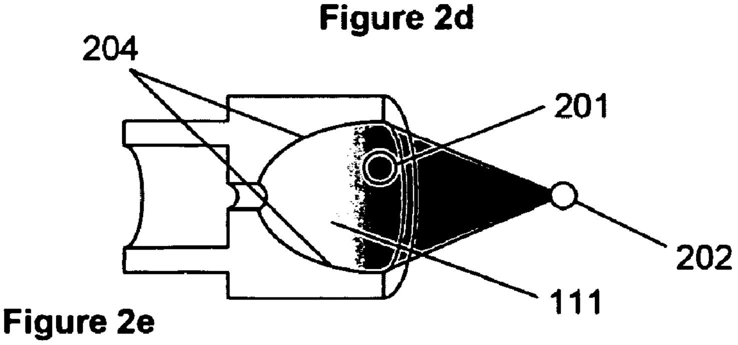

The ultrasonic vibrations emitted from the convex portion 203 of the radiation surface 111 depicted in FIG. 2*c* directs spray 201 radially and longitudinally away from radiation surface 111. Conversely, the ultrasonic vibrations emanating from the concave portion 204 of the radiation surface 111 depicted in FIG. 2*e* focuses spray 201 through focus 202. Maximizing the focusing of spray 201 towards focus 202 may be accomplished by constructing radiation surface 111 such that focus 202 is the focus of an overall parabolic configuration formed in at least two dimensions by concave portion 204. The radiation surface 111 may also possess a conical portion 205 as depicted in FIG. 2*d*. Ultrasonic vibrations emanating from the conical portion 205 direct the atomized spray 201 inwards. The radiation surface may possess any combination of the above mentioned configurations such as, but not limited to, an outer concave portion encircling an inner convex portion and/or an outer planar portion encompassing an inner conical portion.

Regardless of the configuration of the radiation surface, adjusting the amplitude of the ultrasonic vibrations traveling down the length of the horn may be useful in focusing the atomized spray produced. The level of confinement obtained by the ultrasonic vibrations emanating from the radiation surface and/or the ultrasonic energy the vibrations carry depends upon the amplitude of the ultrasonic vibrations traveling down horn. As such, increasing the amplitude of the ultrasonic vibrations may narrow the width of the spray pattern produced; thereby focusing the spray produced. For instance, if the fluid spray exceeds the geometric bounds of the radiation surface, i.e. is fanning too wide, increasing the amplitude of the ultrasonic vibrations may narrow the spray. Conversely, if the spray is too narrow, then decreasing the amplitude of the ultrasonic vibrations may widen the spray. If the horn is vibrated in resonance by a piezoelectric transducer attached to its proximal end, increasing the amplitude of the ultrasonic vibrations traveling down the length of the horn may be accomplished by increasing the voltage of the electrical signal driving the transducer.

The horn may be capable of vibrating in resonance at a frequency of approximately 16 kHz or greater. The ultrasonic vibrations traveling down the horn may have an amplitude of approximately 1 micron or greater. It is preferred that the horn be capable of vibrating in resonance at a frequency between approximately 20 kHz and approximately 200 kHz. It is recommended that the horn be capable of vibrating in resonance at a frequency of approximately 30 kHz.

The signal driving the ultrasound transducer may be a sinusoidal wave, square wave, triangular wave, trapezoidal wave, or any combination thereof.

It should be appreciated that elements described with singular articles such as "a", "an", and/or "the" and/or otherwise described singularly may be used in plurality. It should also be appreciated that elements described in plurality may be used singularly.

Although specific embodiments of apparatuses and methods have been illustrated and described herein, it will be appreciated by those of ordinary skill in the art that any arrangement, combination, and/or sequence that is calculated to achieve the same purpose may be substituted for the specific embodiments shown. It is to be understood that the above description is intended to be illustrative and not restrictive. Combinations of the above embodiments and other embodiments as well as combinations and sequences of the above methods and other methods of use will be apparent to individuals possessing skill in the art upon review the present disclosure.

The scope of the claimed apparatus and methods should be determined with reference to the appended claims, along with the full scope of equivalents to which such claims are entitled.

I claim:

1. An apparatus characterized by:

a. a proximal surface;

b. a radiation surface opposite the proximal surface;

c. at least one radial surface extending between the proximal end and the radiation surface;

d. an internal chamber containing:

i. a back wall;

ii. a front wall;

iii. at least one side wall extending between the back wall and the front wall; and iv. an ultrasonic lens within the back wall;

e. at least one channel originating in a surface other than the radiation surface and opening into the internal chamber;

f. a channel originating in the front wall of the internal chamber and terminating in the radiation surface; and g. being capable of vibrating in resonance at a frequency of approximately 16 kHz or greater.

2. The apparatus according to claim 1 further characterized by at least one point on the ultrasonic lens within the back wall of the chamber lying approximately on an antinode of the vibrations of the apparatus.

3. The apparatus according to claim 1 further characterized by at least one point on the radiation surface lying approximately on an antinode of the vibrations of the apparatus.

4. The apparatus according to claim 1 further characterized by at least one point on the front wall of the chamber lying approximately on a node of the vibrations of the apparatus.

5. The apparatus according to claim 1 further characterized by the channel opening into the chamber originating in a radial surface and opening into a side wall of the internal chamber approximately on a node of the vibrations.

6. The apparatus according to claim 1 further characterized by a transducer attached to the proximal surface.

7. The apparatus according to claim 6 further characterized by a generator to drive the transducer.

8. An apparatus comprising:

a. a proximal surface;

b. a radiation surface opposite the proximal surface;

c. at least one radial surface extending between the proximal end and the radiation surface;

d. an internal chamber containing:

i. a back wall;

ii. a front wall;

iii. at least one side wall extending between the back wall and the front wall; and iv. an ultrasonic lens within the back wall;

e. at least one channel originating in a surface other than the radiation surface and opening into the internal chamber; and f. a channel originating in the front wall of the internal chamber and terminating in the radiation surface.

9. The apparatus according to claim 8 characterized by the maximum height of the internal chamber being larger than the maximum width of the channel originating in the front wall of the internal chamber.

10. The apparatus according to claim 8 characterized by the maximum height of the internal chamber being approximately 200 times larger than the maximum width of the channel originating in the front wall of the internal chamber or greater.

11. The apparatus according to claim 8 characterized by the channel opening into the chamber originating in the proximal surface and opening into the back wall of the internal chamber and the maximum height the of internal chamber being larger than the maximum width of the channel.

12. The apparatus according to claim 8 characterized by the channel opening into the chamber originating in the proximal surface and opening into the back wall of the internal chamber and the maximum height of the internal chamber being approximately 20 times larger than the maximum width of the channel or greater.

13. The apparatus according to claim 8 further comprising one or a plurality of concave portions within the ultrasonic lens that form an overall parabolic configuration in at least two dimensions.

14. The apparatus according to claim 13 characterized by the focus of the parabola formed by the concave portion or portions of the ultrasonic lens lying in proximity to the opening of the channel originating within the front wall of the internal chamber.

15. The apparatus according to claim 8 further comprising at least one planar portion within the radiation surface.

16. The apparatus according to claim 8 further comprising a central axis extending from the proximal surface to the radiation surface and a region of the radiation surface narrower than the width of the apparatus in at least one dimension oriented orthogonal to the central axis.

17. The apparatus according to claim 8 further comprising at least one concave portion within the radiation surface.

18. The apparatus according to claim 8 further comprising at least one convex portion within the radiation surface.

19. The apparatus according to claim 8 further comprising at least one conical portion within the radiation surface.

20. The apparatus according to claim 8 further comprising a transducer attached to the proximal surface capable of inducing the apparatus according to claim 8 to vibrate in resonance at frequency of approximately 16 kHz or greater.

21. The apparatus according to claim 20 further comprising a generator to drive the transducer.

* * * * *